(12) United States Patent
Tu et al.

(10) Patent No.: US 9,921,467 B2
(45) Date of Patent: Mar. 20, 2018

(54) MASK BLANK AND MASK AND FABRICATION METHOD THEREOF

(71) Applicant: TAIWAN SEMICONDUCTOR MANUFACTURING COMPANY LTD., Hsinchu (TW)

(72) Inventors: Chih-Chiang Tu, Taoyuan (TW); Chun-Lang Chen, Tainan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 146 days.

(21) Appl. No.: 14/954,602

(22) Filed: Nov. 30, 2015

(65) Prior Publication Data

US 2017/0153539 A1    Jun. 1, 2017

(51) Int. Cl.
| | |
|---|---|
| *G03F 1/26* | (2012.01) |
| *H01L 21/033* | (2006.01) |
| *G03F 1/80* | (2012.01) |
| *G03F 1/60* | (2012.01) |

(52) U.S. Cl.
CPC ............... *G03F 1/26* (2013.01); *G03F 1/60* (2013.01); *G03F 1/80* (2013.01); *H01L 21/0332* (2013.01); *H01L 21/0337* (2013.01); *H01L 21/0338* (2013.01)

(58) Field of Classification Search
CPC ..... G03F 1/16; G03F 1/26; G03F 1/50; G03F 1/60; G03F 1/80
USPC .............................................................. 430/5
See application file for complete search history.

(56) References Cited

U.S. PATENT DOCUMENTS

| | | | |
|---|---|---|---|
| 2006/0204860 A1* | 9/2006 | Pas ............................. | G03F 1/26 430/5 |
| 2011/0195349 A1* | 8/2011 | Anderson ................ | G03F 1/29 430/5 |
| 2012/0202139 A1* | 8/2012 | Rankin ..................... | G03F 1/76 430/5 |

* cited by examiner

*Primary Examiner* — John A McPherson
(74) *Attorney, Agent, or Firm* — WPAT, P.C., Intellectual Property Attorneys; Anthony King

(57) ABSTRACT

A mask blank and a mask are provided. The mask blank includes a substrate, and an etching stop layer embedded in the substrate. The mask includes the mask blank with the embedded etching stop layer, and a plurality of recesses formed in the mask blank. The recess exposes the embedded etching stop layer.

20 Claims, 15 Drawing Sheets

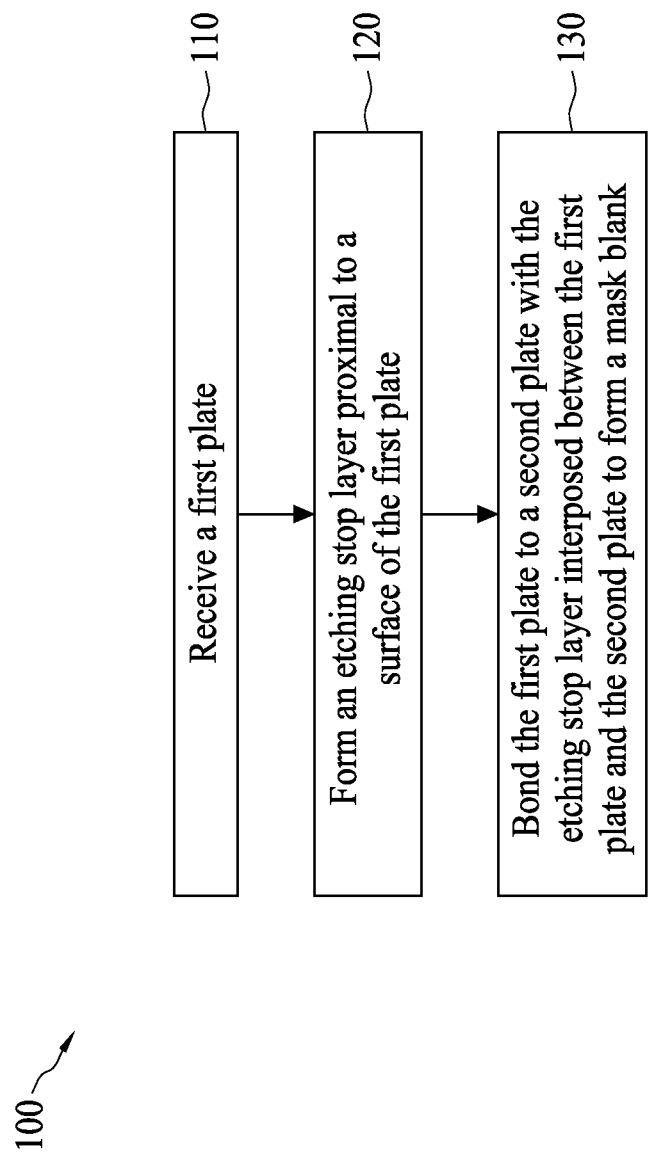

MASK BLANK AND MASK AND FABRICATION METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased.

This scaling down process generally provides benefits by increasing production efficiency and lowering associated costs. Such scaling down has also increased the complexity of processing and manufacturing ICs. For these advances to be realized, similar developments in IC processing and manufacturing are needed. For example, mask used in high-resolution lithography to transfer small and complex circuit pattern may present new challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a method for manufacturing a mask blank according to various aspects of the present disclosure.

DETAILED DESCRIPTION

Figure 2A:
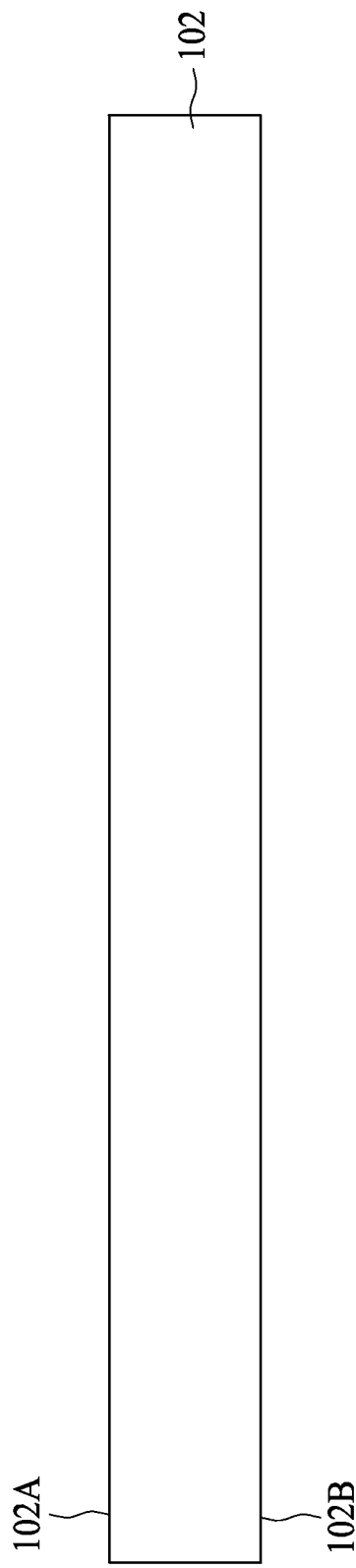
FIGS. 2A, 2B, 2C, 2D and 2E are cross-sectional views at one of various operations of manufacturing a mask blank according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a mask blank or a mask with embedded etching stop layer is provided. The etching stop layer is optically and/or physically compatible with the material of a mask substrate, and thus the optical characteristics such as index of refraction and/or physical characteristics such as coefficient of thermal expansion of the etching stop layer are substantially identical to those of the material of substrate. Consequently, image distortion and mask warpage are minimized. The embedded etching stop layer makes it possible to accurately control the depth of a phase-shifting recess without affecting the optical characteristics of the mask.

FIG. 1 illustrates a method 100 for manufacturing a mask blank according to various aspects of the present disclosure. The method 100 begins with operation 110 in which a first plate is received. The method 100 continues with operation 120 in which an etching stop layer is formed proximal to a surface of the first plate. In some embodiments, the etching stop layer is formed over the surface of the first plate. In some embodiments, the etching stop layer is formed inside the first plate under the surface of the first plate. For example, a portion of the first plate proximal to the surface of the first plate forms the etching stop layer. The method 100 proceeds with operation 130 in which the first plate is bonded to a second plate with the etching stop layer interposed between the first plate and the second plate to form a mask blank.

FIGS. 2A, 2B, 2C, 2D and 2E are cross-sectional views at one of various operations of manufacturing a mask blank according to some embodiments of the present disclosure. As depicted in FIG. 2A and operation 110 in FIG. 1, the method 100 begins at operation 110 in which a first plate 102 is received. In some embodiments, the first plate 102 is a quartz substrate. In some alternative embodiments, the first plate 102 may be formed of a variety of suitable transparent materials, including glass, low thermal expansion materials (LTEMs), silica, silicon carbide, calcium fluoride, or other materials that may be apparent to those skilled in the art. In some embodiments, the thickness of the first plate 102 is several millimeters, e.g., about 2 mm, but not limited thereto.

Figure 2B:
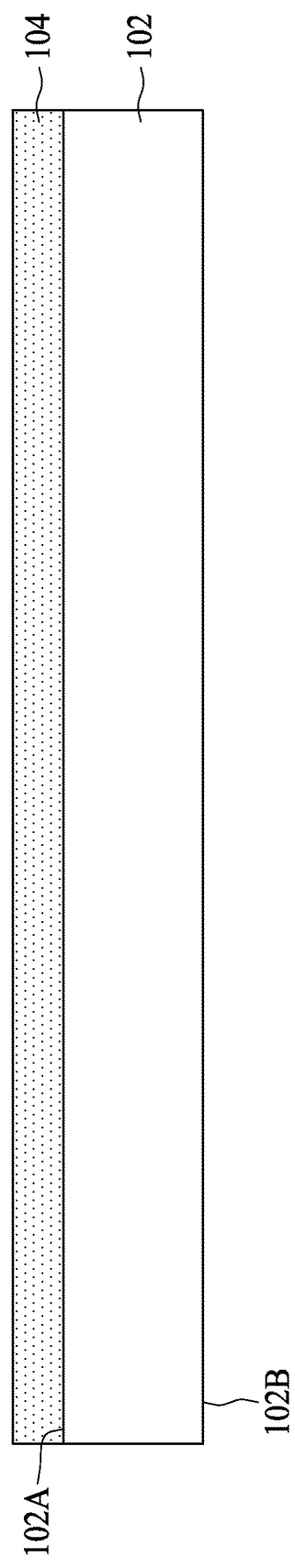

As depicted in FIG. 2B and operation 120 in FIG. 1, the method 100 continues with operation 120 in which an etching stop layer 104 is formed proximal to a surface 102A of the first plate 102. In some embodiments, the material of the etching stop layer 104 is optically compatible with the material of the first plate 102. The etching stop layer 104 is described as optically compatible as it may be made of materials such that the optical characteristics of the etching stop layer 104, e.g., index of refraction, dielectric constant, reflectivity or the like, are substantially the same as those of the first plate 102 under the same exposure radiation, e.g., Argon fluoride (ArF) excimer laser. In some embodiments, the material of the etching stop layer 104 is physically compatible with the material of the first plate 102. The etching stop layer 104 is described as physically compatible as it may be made of materials such that the physical characteristics of the etching stop layer 104, e.g., coefficient of thermal expansion, are substantially the same as those of the first plate 102.

In the present embodiment, the etching stop layer 104 is formed on the surface 102A of the first plate 102. By way of example, the etching stop layer 104 is deposited by, for example, chemical vapor deposition (CVD), physical vapor deposition (PVD) or other deposition techniques on the surface 102A of the first plate 102. Example of the material of the etching stop layer 104 includes oxide compound (e.g., silicon oxide), nitride compound (e.g., silicon nitride), oxynitride compound (e.g., silicon oxynitride), silicide compound (e.g., molybdenum silicide (MoSi)), combinations thereof, or other materials that may be apparent to those skilled in the art.

In some alternative embodiments, the etching stop layer 104 is formed through the surface 102A and located in a portion of the first plate 102 proximal to the surface 102A. By way of example, one or more dopants (e.g., boron or phosphorous) are doped into the first plate 102 through the surface 102A. As a result, the doped portion of the first plate 102 has different etching characteristics from that of the un-doped portion, thereby achieving the etching stop layer 104. In some embodiments, the thickness of the etching stop layer 104 is several nanometers. For example, the thickness ranges between about 5 nm and about 10 nm, or is less than about 5 nm, but not limited thereto.

Figure 2C:
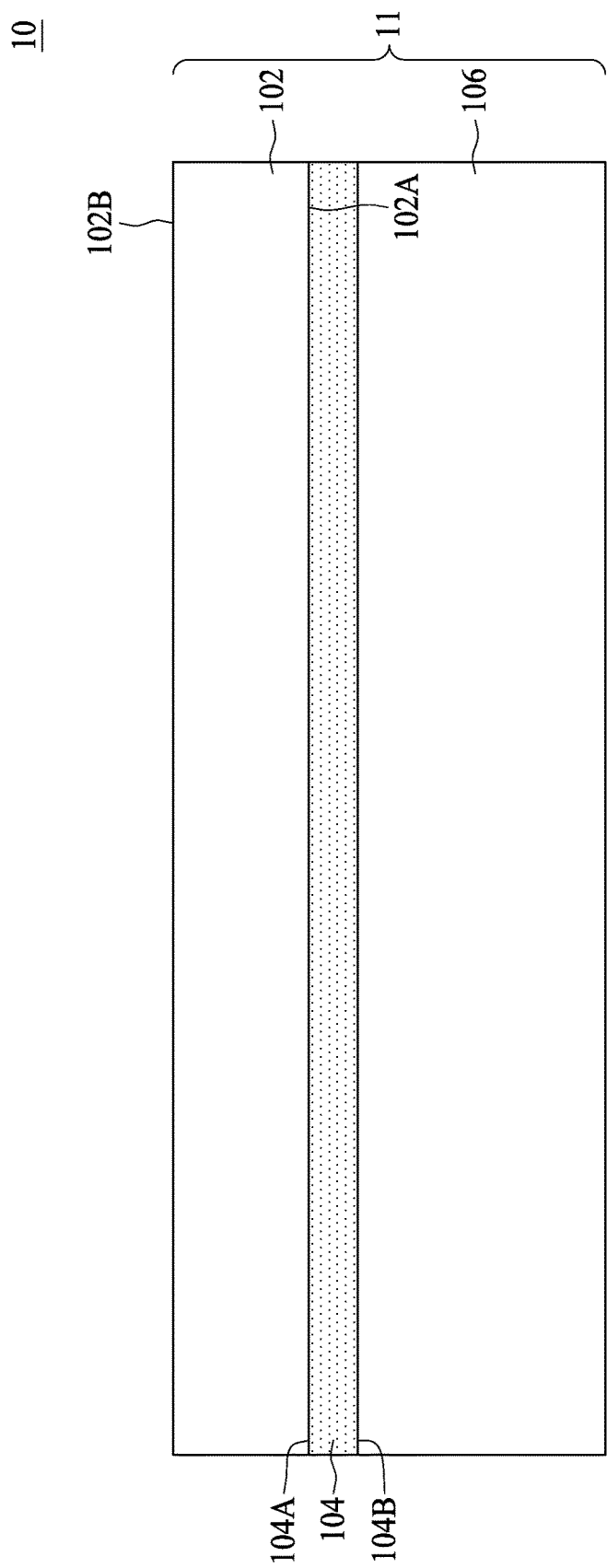

As depicted in FIG. 2C and operation 130 in FIG. 1, the method 100 proceeds with operation 130 in which a second plate 106 is received. Subsequently, the first plate 102 is bonded to the second plate 106, with the etching stop layer 104 interposed between the first plate 102 and the second plate 106 to form a mask blank 10. In some embodiments, the first plate 102 is turned over to face the etching stop layer 104 towards the second plate 106, and then bonded to the second plate 106. In some embodiments, the material of the second plate 106 is the same as that of the first plate 102. Accordingly, the material of the second plate 106 is also optically and physically compatible with that of the etching stop layer 104 and the first plate 102. The optical compatibility among the second plate 106, the etching stop layer 104 and the first plate 102 helps alleviate image distortion during photolithography. Furthermore, the physical compatibility among the second plate 106, the etching stop layer 104 and the first plate 102 in, e.g., coefficient of thermal expansion, helps alleviate structure deformation and warpage due to, e.g., heat induced by exposure radiation.

In some embodiments, the thickness of the second plate 106 is greater than the first plate 102. The thickness of the second plate 106 is several millimeters, e.g., about 6.23 mm±0.1 mm, but not limited thereto. In some embodiments, the first plate 102 and the second plate 106 are placed and stacked to each other with the etching stop layer 104 sandwiched the first plate 102 and the second plate 106. A thermal treatment is then performed to bond the first plate 102 and the second plate 106. In some embodiments, the temperature of the thermal treatment ranges from 500° C. to 700° C., e.g., 650° C., but not limited thereto. In some embodiments, an annealing treatment is alternatively performed to repair defect. In some embodiments, the temperature of the annealing treatment is higher than the thermal treating. By way of example, the annealing temperature ranges from 1000° C. to 1200° C., e.g., 1100° C., but not limited thereto. In some alternative embodiments, the first plate 102 and the second plate 106 are bonded by other direct or indirect bonding operations.

Accordingly, the mask blank 10 includes a substrate 11 formed by the first plate 102 and the second plate 106, and the etching stop 104 embedded in the substrate 11. The first surface 104A (e.g., upper surface) and the second surface 104B (e.g., bottom surface) opposite to each other are thus covered by the substrate 11.

Figure 2D:
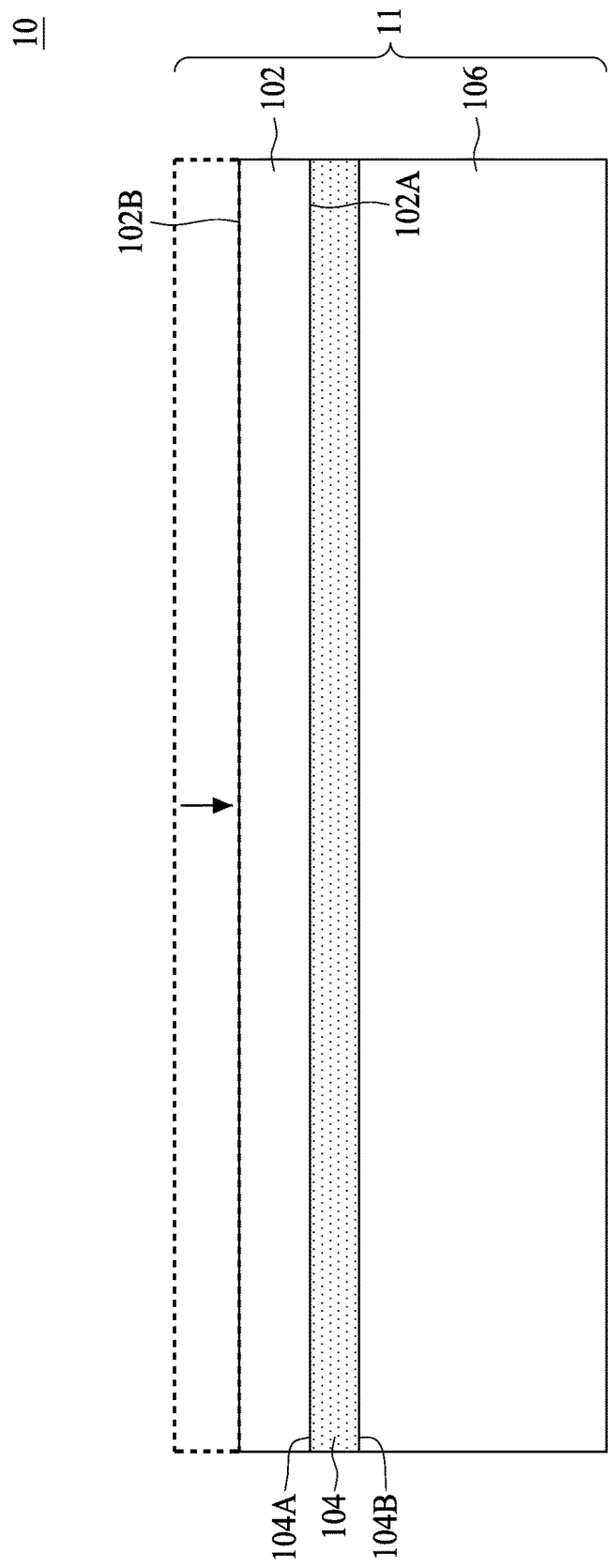

As depicted in FIG. 2D, a thinning operation, e.g., a surface polishing (as denoted by arrow symbol) is optionally performed on the other surface 102B (external surface) of the first plate 102 to thin the first plate 102. In some embodiments, the thickness of the first plate 102 is reduced to be substantially equal to the depth of recess (best shown in FIG. 5E) to be formed when the mask blank is used as a base of a mask. By way of example, the thickness of the first plate 102 is reduced to about 180 nm, but not limited thereto. In some embodiments, the sum of the reduced thickness of the first plate 102 and the thickness of the etching stop layer 104 is substantially equal to the depth of recess to be formed. The surface polishing may be implemented by chemical and/or mechanical polishing, or any other suitable polishing techniques.

Figure 3:
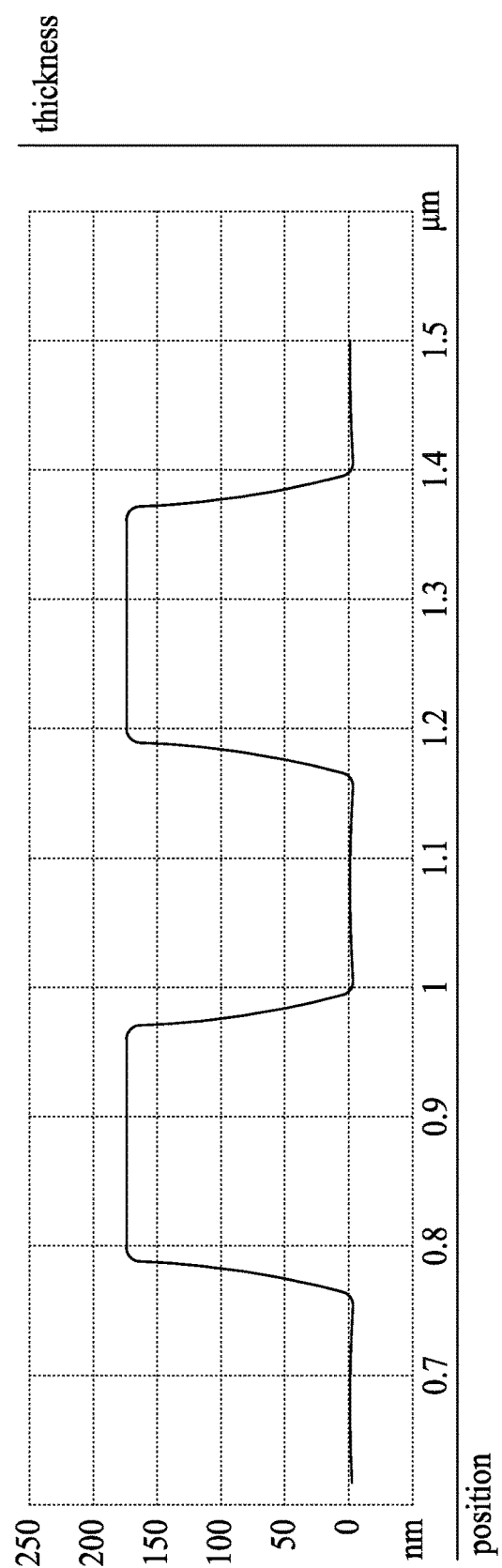
FIG. 3 illustrates a measurement result of film thickness of the mask blank.

FIG. 3 illustrates a measurement result of film thickness of the mask blank. As shown in FIG. 3, the depth of recess is accurately controlled to be the desired depth (180 nm). In addition, the depth of recess is consistent, and the thickness of the unrecessed portion is also consistent. The consistent recess depth ensures a consistent phase-shifting effect.

In some embodiments, the surface 102B of the first plate 102 in the mask blank 10 is covered with overlying layer(s), e.g., hard mask layer(s), shift layer(s), sacrificial layer(s), absorb layer(s) or anti-reflection layer(s) before the mask blank 10 is used to manufacture a mask. Each of the aforementioned overlying layers may be optionally formed on the mask blank 10 based on different requirements of the mask to be fabricated. In addition, the material and thickness of the mask may be selected discretionarily for a desired application.

Figure 2E:
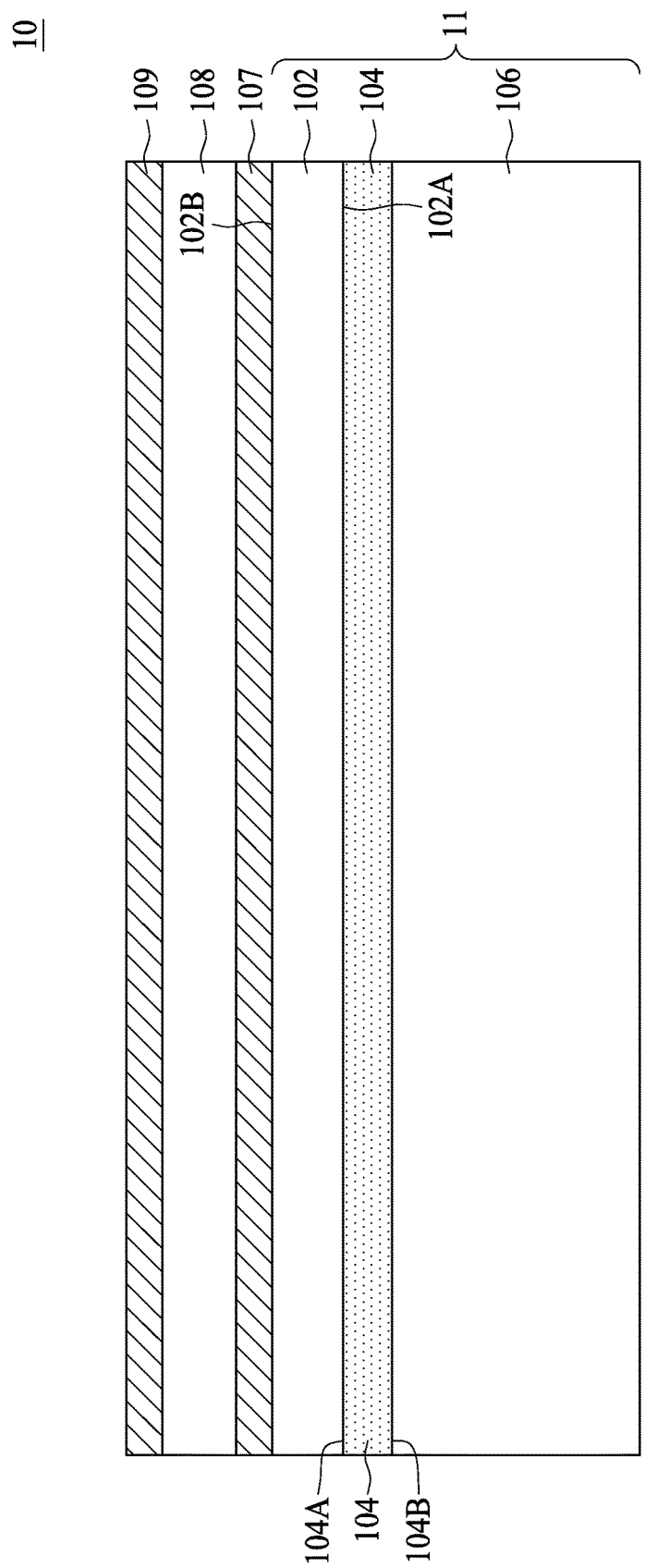

In some embodiments, a first hard mask layer 107, a sacrificial layer 108 (also referred to as a shift layer) and a second hard mask layer 109 are formed over the first plate 102, and become part of the mask blank 10 as depicted in FIG. 2E.

In some alternative embodiments, the etching stop layer 104 is formed in a one-piece substrate rather than between two plates bonded together. By way of example, the etching stop layer 104 is formed inside a substrate at a level distant to the surface of the substrate by, e.g., ion implantation. In some embodiments, the lateral surface of the etching stop layer 104 is also surrounded by the substrate. In some embodiments, one of the surfaces of the substrate is thinned to reduce the distance between the surface of the substrate and the etching stop layer 104 to a desired distance. In some embodiments, the desired distance is substantially equal to the depth of recess to be subsequently formed.

Figure 4:
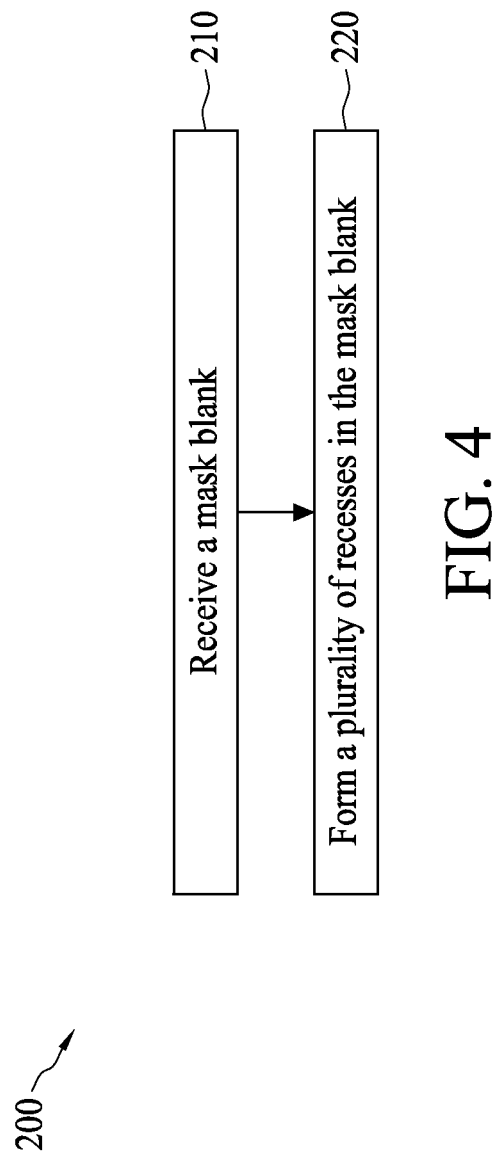
FIG. 4 illustrates a method for manufacturing a mask according to various aspects of the present disclosure.

FIG. 4 illustrates a method 200 for manufacturing a mask according to various aspects of the present disclosure. The method 200 begins with operation 210 in which a mask blank is received. The method 200 continues with operation 220 in which a plurality of recesses are formed in the mask blank.

Figure 5A:
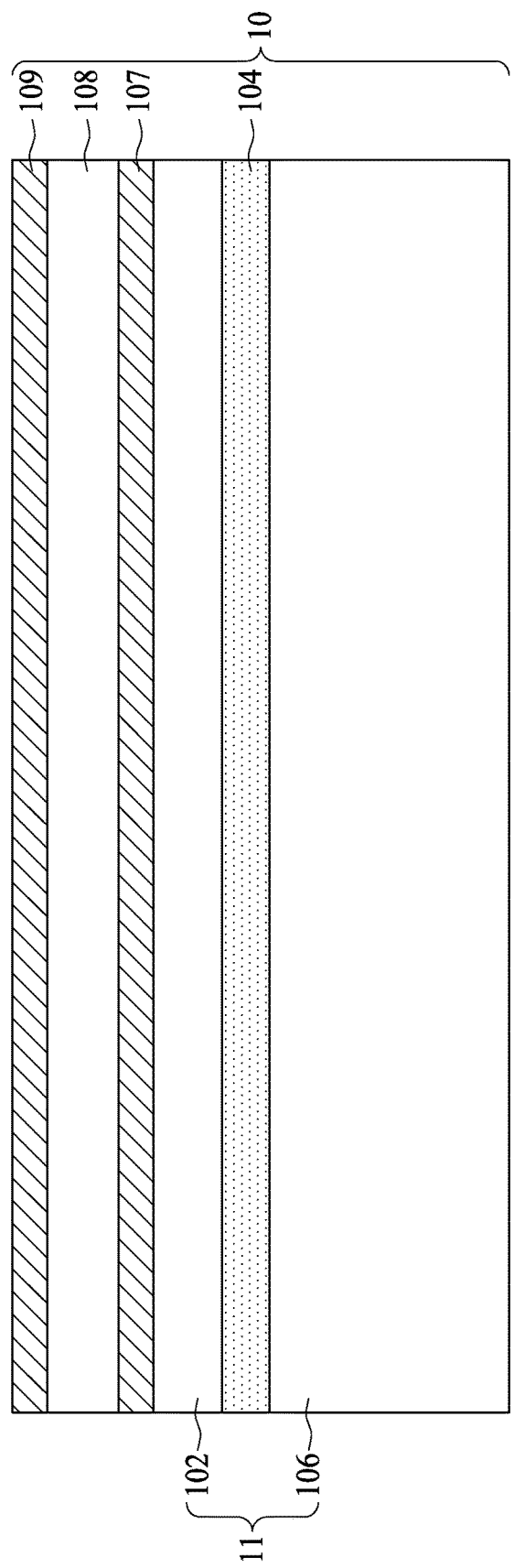
FIGS. 5A, 5B, 5C, 5D, 5E and 5F are cross-sectional views at one of various operations of manufacturing a mask according to some embodiments of the present disclosure.

FIGS. 5A, 5B, 5C, 5D, 5E and 5F are cross-sectional views at one of various operations of manufacturing a mask according to some embodiments of the present disclosure. As depicted in FIG. 5A and operation 210 in FIG. 4, the method 200 begins at operation 210 in which a mask blank 10 is received. In some embodiments, the mask blank 10 is formed by the aforementioned method described in FIGS. 1 and 2A to 2E. The mask blank 10 includes the etching stop layer 104 embedded in the substrate 11 formed by the bonded first plate 102 and second plate 106. In some embodiments, the first hard mask layer 107, the sacrificial layer 108 (also referred to as a shift layer) and the second hard mask layer 109 are consequently formed over the mask blank 10.

Materials for the first hard mask layer 107 may include chromium, chromium oxide, chromium nitride, silicon nitride, silicon oxynitride, tantalum oxide, tantalum nitride, tantalum oxynitride, or any other suitable materials for a hard mask in an etching operation. Materials for the sacrificial layer 108 may include molybdenum silicide (MoSi) or the like. Materials for the second hard mask layer 109 may include chromium, chromium oxide, chromium nitride, silicon nitride, silicon oxynitride, tantalum oxide, tantalum nitride, tantalum oxynitride, or other suitable materials for a hard mask in an etching operation. In some embodiments, the first hard mask layer 107 and the second hard mask layer 109 are of the same material. In some embodiments, the material of the sacrificial layer 108 and that of the first and second hard mask layers 107, and 109 have distinct etching selectivity, or different etching by-products that can be detected. In some embodiments, the material of the sacrificial layer 108 may include the material used for a phase shift layer such that the fabrication is compatible with fabrication of phase-shifting mask (PSM) or other types of masks.

Figure 5B:
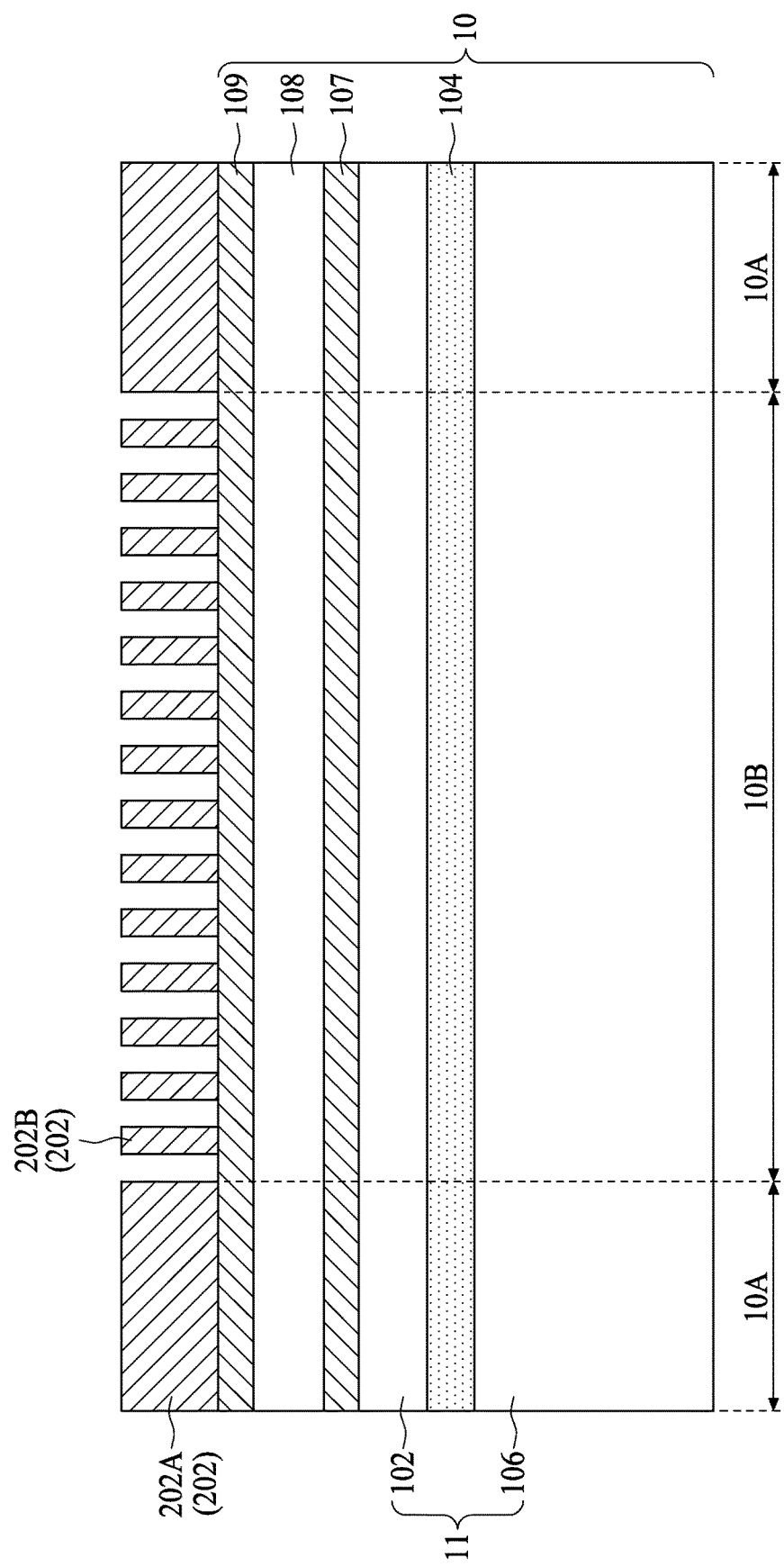

As depicted in FIGS. 5B, 5C, 5D, 5E and 5F and operation 220 in FIG. 4, the method 200 continues with operation 220 in which a plurality of recesses are formed in the mask blank 10. In some embodiments, the recesses are formed by, but not limited to, the following operations. As depicted in FIG. 5B, a resist layer 202 such as a photoresist layer is formed by, e.g., a photolithography exposure, on the second hard mask layer 109. The resist layer 202 has a first portion 202A in a peripheral region 10A of the blank mask 10, and a second portion 202B in a central region 10B of the blank mask 10. First portion 202A substantially covers the peripheral region 10A, and the second portion 202B includes a plurality of mesas partially covers the central region 10B. Moreover, gaps between adjacent mesas expose the central region 10B not covered by the mesas.

In some alternative embodiments, the photolithography exposure may be replaced by other suitable techniques such as mask-less photolithography exposure, electro-beam writing, direct writing, and/or ion-beam writing.

Figure 5C:
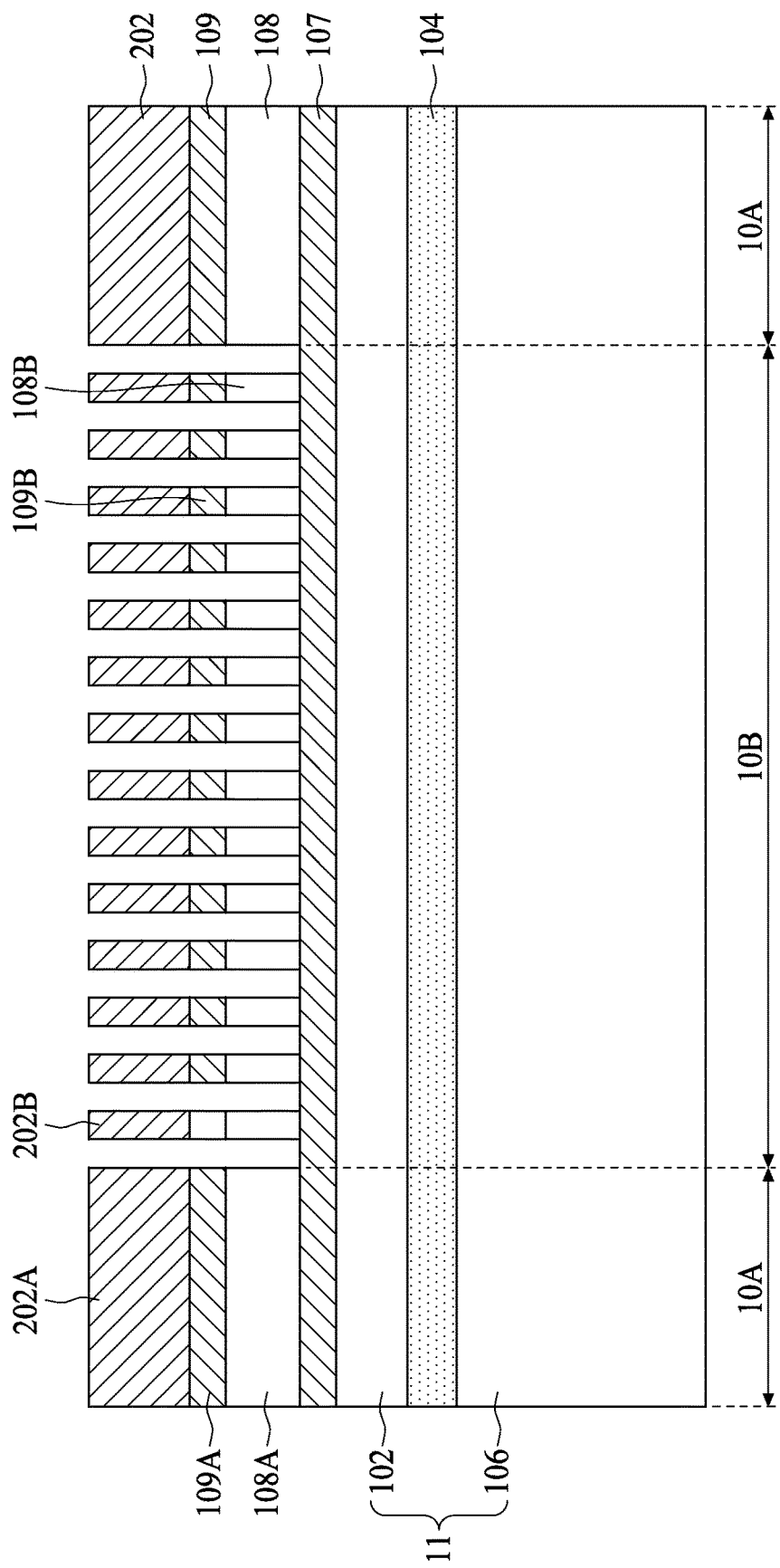

As depicted in FIG. 5C, the second hard mask layer 109 exposed by the resist layer 202 is removed by, e.g., a dry etching and/or wet etching to form a first portion 109A in the peripheral region 10A, and a second portion 109B in the central region 10B. The second portion 109B exposes a portion of the sacrificial layer 108. Subsequently, the sacrificial layer 108 exposed by the portion 109B of the second hard mask layer 109 is removed by, e.g., a dry etching and/or wet etching to form a first portion 108A and a second portion 108B, which substantially correspond to the first portion 109A and the second portion 109B, respectively. The second portion 108B of the sacrificial layer 108 exposes a portion of the first hard mask layer 107. In some embodiments, while not depicted, the resist layer 202 has been removed before etching the sacrificial layer 108, and the second hard mask layer 109 is used as a hard mask to etch the sacrificial layer 108. In some embodiments, the resist layer 202 is reserved on the second hard mask layer 109 when etching the sacrificial layer 108, and will be removed afterward.

Figure 5D:
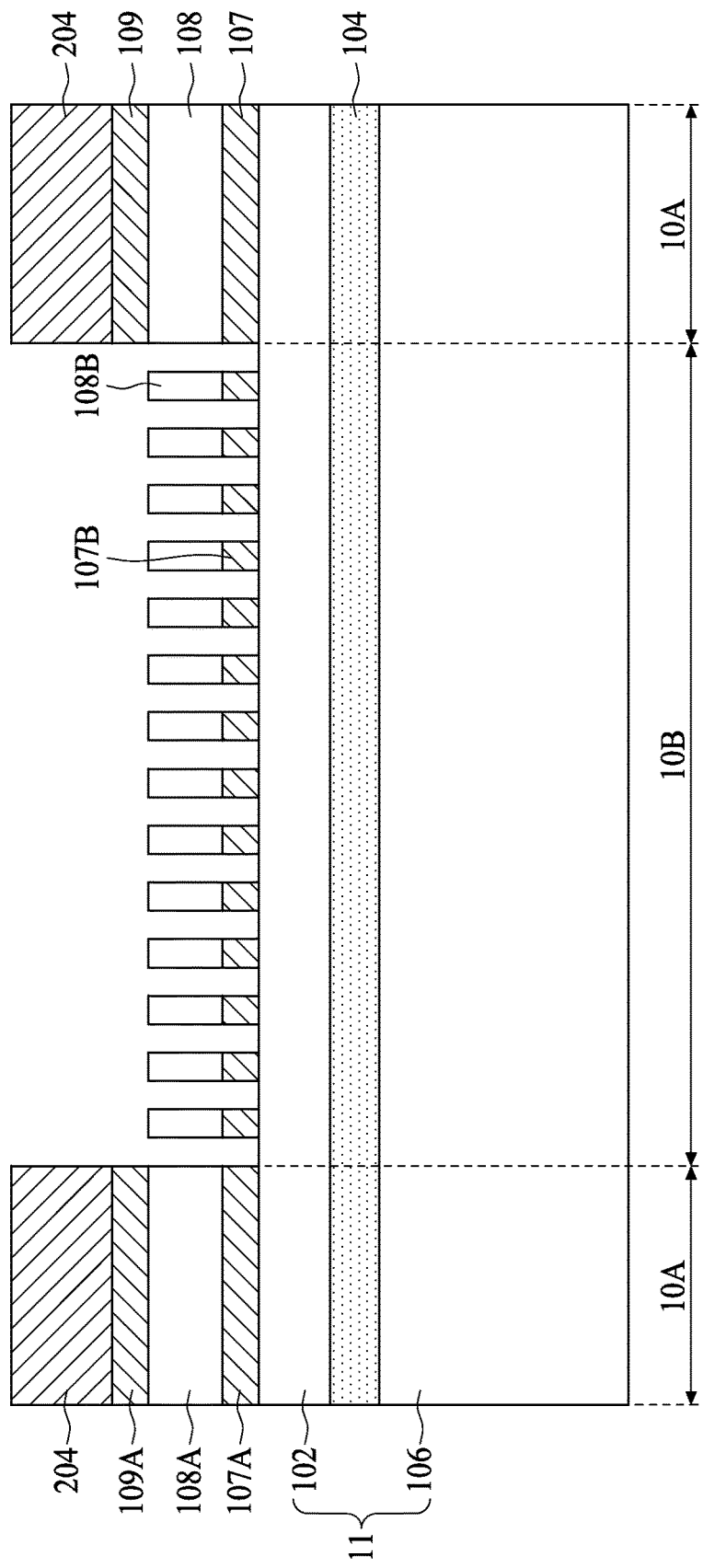

As depicted in FIG. 5D, another resist layer 204 such as a photoresist layer is formed by, e.g., photolithography exposure to cover the first portion 109A, and to expose the second portion 109B of the second hard mask layer 109 and to expose a portion of the first hard mask layer 107 revealed by the second portion 109B of the second hard mask layer 109. In some embodiments, the resist layer 204 is formed in the peripheral region 10A but not in the central region 10B. That is, the resist layer 204 is formed on the even surface of the first portion 109A of the second hard mask layer 109 without passing the height gap between the peripheral region 10A and the central region 10B. Accordingly, the resist layer 204 has desirable uniformity in thickness. In some alternative embodiments, the photolithography exposure may be replaced by other suitable techniques such as mask-less photolithography exposure, electro-beam writing, direct writing, and/or ion-beam writing. The second portion 109B of the second hard mask layer 109 is removed, along with the exposed first hard mask layer 107, by a dry etching and/or wet etching, for example. The first hard mask layer 107, after being etched, includes a first portion 107A in the peripheral region 10A, and a second portion 107B in the central region 10B covered by the second portion 108B of the sacrificial layer 108. Accordingly, a portion of the substrate 11 (the upper surface of the first plate 102) is exposed. While not depicted in FIG. 5D, the resist layer 204 is then removed.

Figure 5E:
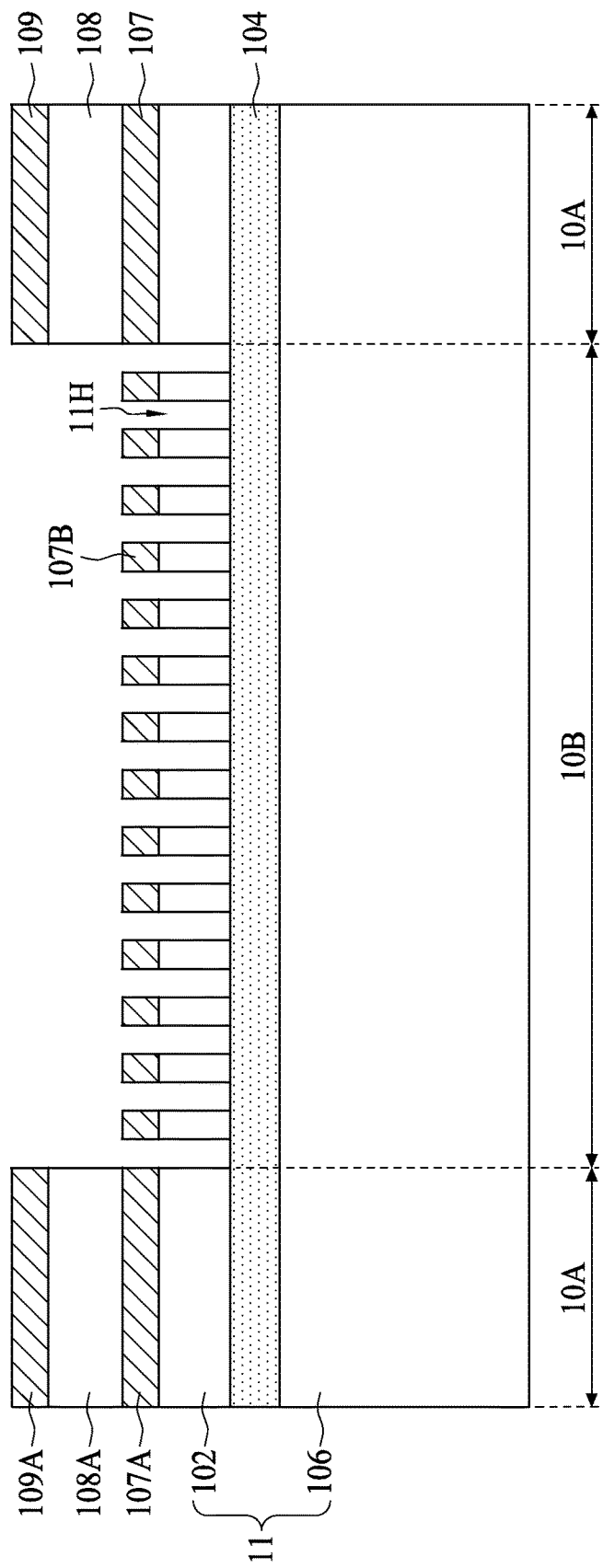

As depicted in FIG. 5E, the second portion 108B of the sacrificial layer 108 is removed by, e.g., a dry etching and/or wet etching to expose the second portion 107B of the first hard mask layer 107, while the first portion 108A of the sacrificial layer 108 protected by the first portion 109A of the second hard mask layer 109 is reserved. Subsequently, the first portion 109A of the second hard mask layer 109 and the second portion 107B of the first hard mask layer 107 are used as a hard mask to remove the substrate 11 through the exposed surface of the substrate 11 to form recesses 11H. In some embodiments, the recesses 11H is removed by, e.g., a dry etching and/or wet etching. During the etching of the substrate 11, the etching stop layer 104 embedded in the substrate 11 is served as an etching stop, and thus the etching can be accurately stopped when the etching stop layer 14 is exposed. In some embodiments, the by-product generated in etching the substrate 11 and the by-product generated in etching the etching stop layer 104 are different and detectable, so that an end point can be accurately detected by analyzing the composition of the by-product. By way of example, a residual gas analyzer (RGA) can be used to detect the end point of etching by analyzing the composition of by-products in etching.

With the embedded etching stop layer 14, the thickness of the recess 11H can be precisely controlled by a predetermined thickness of the substrate 11 over the etching stop layer 14, i.e., the thickness of the first plate 12. In some embodiments, the thickness of the substrate 11 over the etching stop layer 14 is adjusted by polishing or grinding the first plate 12 of the mask blank 10 to be substantially equal to the depth of recess 11H to be formed. In some embodiments, the depth of the recess 11H is designed depending on a desired phase shift degree with respect to the unrecessed portion of the substrate 11, the wavelength of exposure light source in the photolithography process, and other factors required to be considered. For example, the depth of the recess 11H is configured to render a 180-degree phase shift to the recess portion with respect to the unrecessed portion.

Figure 5F:
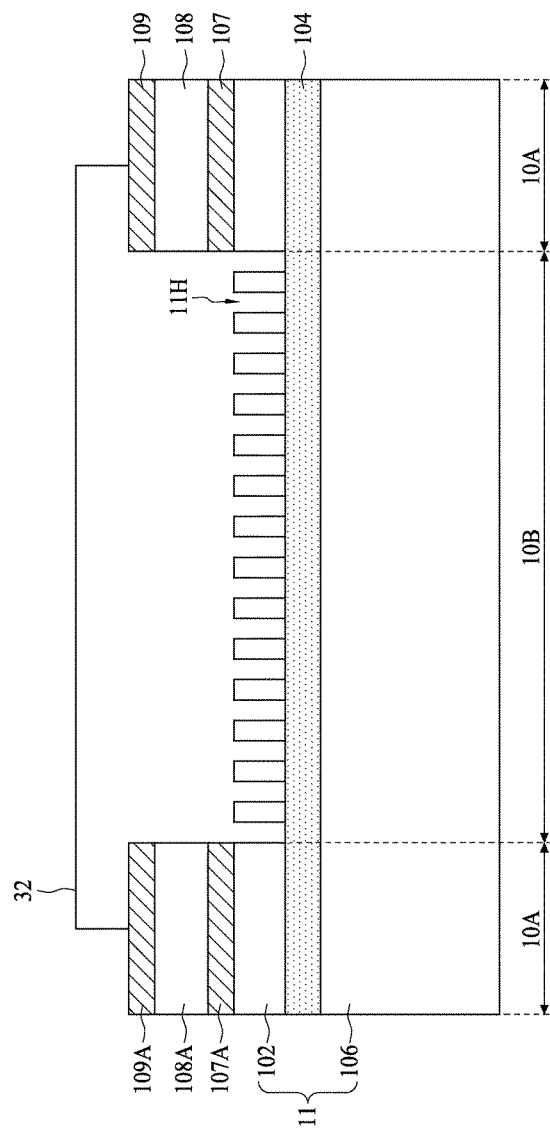

As depicted in FIG. 5F, the second portion 107B of the first hard mask layer 107 is removed by, e.g., stripping to form a mask (alternatively referred to as a photomask or a reticle) 30. In some embodiments, the first portion 109A of the second hard mask layer 109 is removed. In some embodiments, an after stripping inspection (ASI) is performed on the mask 30. If defects are found, a repairing operation may be executed. In some embodiments, the mask 30 is cleaned, and a pellicle 32 is mounted on the mask 30 to protect the mask 30 from particle contamination.

In some embodiments, the second hard mask layer 109 is etched off in multiple steps. By way of example, the second hard mask layer 109 is etched to form the second portion 109B with mesas and gaps therebetween in one etching, and the second portion 109 is then etched off in another etching. This multiple-step etching minimizes defect compared to a single etching in which a massive area of the second hard mask layer 109 is etched. Similarly, the sacrificial layer 108 and the first hard mask layer 107 in the central region 10B are both etched off in at least two etchings, which prevents a massive area etching in a single etching. Consequently, defect issue due to massive area etching is avoided. In some embodiments, with the embedded etching stop layer 104, lateral etching of the substrate 11 when forming the recess 11H is restrained, and thus the profile of the recess 11H can be controlled. The recess 11H with desired profile ensures the pattern transfer accuracy of a target layer such as a photoresist layer when using the mask 30 in photolithography exposure, and consequently the critical dimension of the circuit layer can be maintained.

Figure 6:
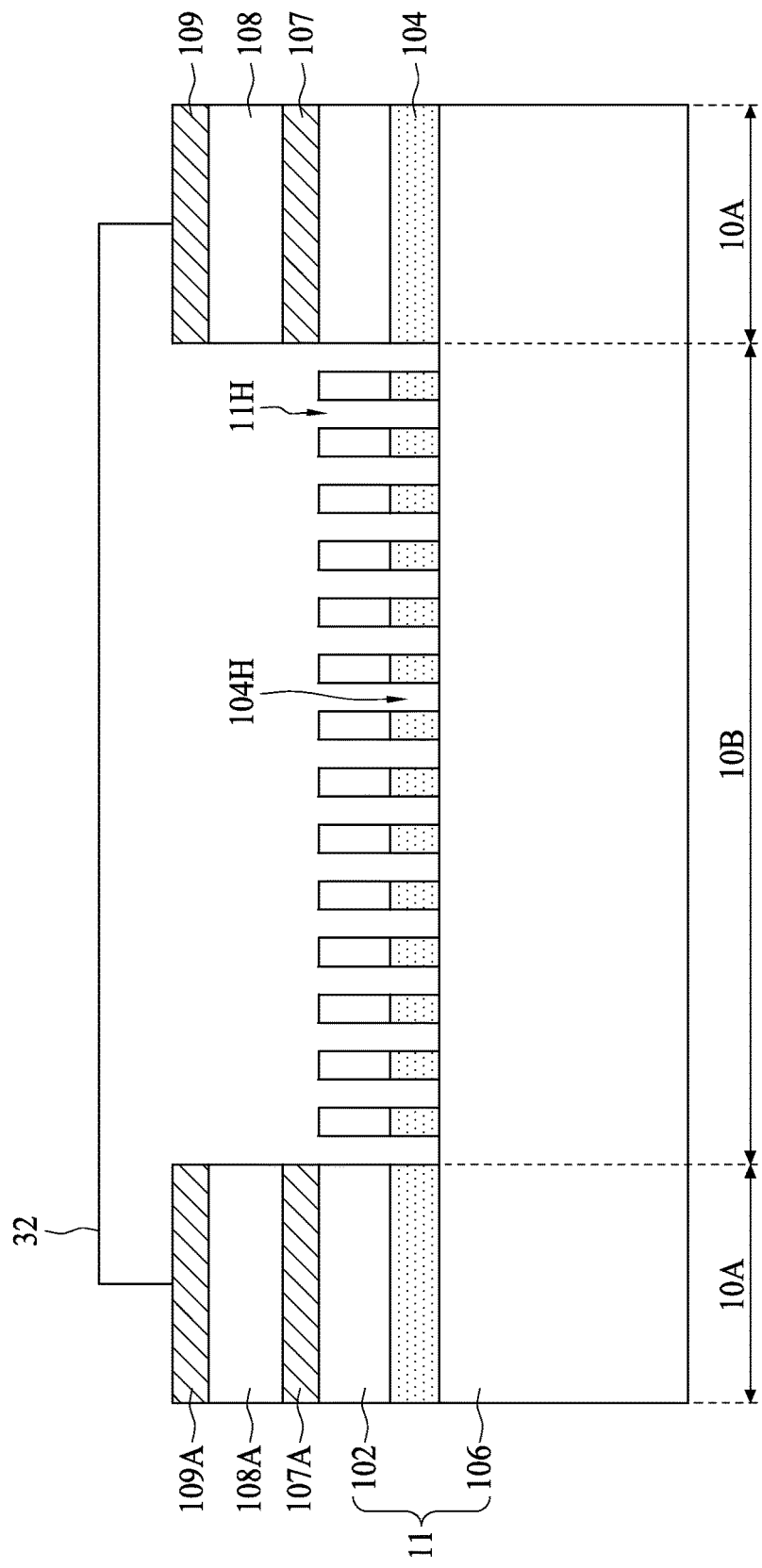
FIG. 6 is a schematic diagram of some embodiments of a mask.

FIG. 6 is a schematic diagram of some embodiments of a mask. As depicted in FIG. 6, one difference between the mask 30 and the mask 40 is that the etching stop layer 104 of the mask 40 exposed underneath the recesses 11H is removed by, e.g., a dry etching and/or wet etching after the recesses 11H are formed. In some embodiments, the etching stop layer 104 underneath the recesses 11H is etched through, thereby forming a plurality of openings 104H connecting the recesses 11H, respectively. In some embodiments, the sum of the depth of the recess 11H and the depth of the opening 104H is designed depending on desired phase shift degree with respect to the unrecessed portion of the substrate 11, the wavelength of exposure light source in the photolithography exposure, or other factors required to be considered. For example, the sum of the depth of the recess 11H and the depth of the opening 104H renders 180 degree phase shift to the recess portion with respect to the unrecessed portion.

In the present disclosure, the mask blank with embedded etching stop layer is adaptable to form any suitable mask with recess such as chrome-less phase-shifting lithography (CPL) mask, phase-shifting mask (PSM) such as attenuating phase-shifting mask (AttPSM) and alternating phase-shifting mask (altPSM), or the like.

In the present disclosure, the mask blank or the mask with embedded etching stop layer optically and/or physically compatible with the material of the mask substrate, and thus the optical characteristics e.g. index of refraction and/or physical characteristics e.g. coefficient of thermal expansion of the etching stop layer is substantially equal to that of the material of substrate. Consequently, image distortion and mask warpage are minimized. The embedded etching stop layer makes it possible to accurately control the depth of phase-shifting recess, and therefore the phase-shifting value can be precisely controlled.

In some embodiments, a mask blank is provided. The mask blank comprises a substrate, and an etching stop layer embedded in the substrate. The etching stop layer has a first surface and a second surface opposite to each other, and the first surface and the second surface are covered by the substrate.

In some embodiments, a mask is provided. The mask comprises a substrate, an etching stop layer, a plurality of recesses, and an overlying layer. The etching stop layer is embedded in the substrate. The recesses are in the substrate, and located in a central region of the mask. The overlying layer is over the substrate in a peripheral region of the mask.

In some embodiments, a method for manufacturing a mask is provided. The method comprises receiving a mask blank comprising a substrate and an etching stop layer embedded in the substrate, and forming a plurality of recesses in the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask, comprising:
    a substrate comprising a plurality of protruding portions, wherein each of the plurality of protruding portions includes an upper surface;
    an etching stop layer embedded in the substrate;
    a plurality of recesses in the substrate, wherein the recesses are located in a central region of the mask, and separated by the protruding portions of the substrate; and
    an overlying layer over the substrate in a peripheral region of the mask, wherein the overlying layer comprises a stack of a hard mask layer and a shift layer, and the upper surface of each of the protruding portions of the substrate is exposed from the hard mask layer and the shift layer.

2. The mask of claim 1, wherein the recesses partially expose a surface of the etching stop layer.

3. The mask of claim 1, wherein the etching stop layer has a plurality of openings connecting the recesses, respectively.

4. The mask of claim 1, wherein the etching stop layer is optically compatible with the substrate.

5. The mask of claim 4, wherein an index of refraction of the etching stop layer is substantially equal to that of the substrate.

6. The mask of claim 1, wherein the etching stop layer is physically compatible with the substrate.

7. The mask of claim 6, wherein a coefficient of thermal expansion of the etching stop layer is substantially equal to that of the substrate.

8. The mask of claim 1, wherein the overlying layer further comprises another hard mask layer over the shift layer, and the upper surface of each of the protruding portions is exposed from the another hard mask layer.

9. A method for manufacturing a mask, comprising:
    receiving a mask blank comprising a substrate, an etching stop layer embedded in the substrate, and a first hard mask layer over the substrate;
    patterning the first hard mask layer to form a patterned first hard mask layer, wherein the patterned first hard mask layer comprises a first portion over a peripheral region of the substrate, and a plurality of second portions over a central region of the substrate;

forming a plurality of recesses in the substrate exposed from the second portions of the patterned first hard mask layer; and removing each of the second portions of the patterned first hard mask layer from the substrate, and remaining the first portion of the pattern first hard mask layer over the substrate.

10. The method of claim 9, wherein the mask blank comprises:
a first plate;
a second plate bonded to the first plate; and
the etching stop layer sandwiched between the first plate and the second plate.

11. The method of claim 9, wherein the mask blank further comprises:
a sacrificial layer over the first hard mask layer; and
a second hard mask layer over the sacrificial layer.

12. The method of claim 11, further comprising:
patterning the second hard mask layer, and using the second hard mask layer as a hard mask to pattern the sacrificial layer to partially expose the first hard mask layer;
blocking a portion of the patterned second hard mask layer, and removing the unblocked portion of the patterned second hard mask layer and the first hard mask layer exposed by the sacrificial layer; and
removing the sacrificial layer exposed by the patterned second hard mask to reveal the patterned first hard mask layer.

13. A mask, comprising:
a substrate comprising a plurality of protruding portions, wherein each of the plurality of protruding portions includes an upper surface;
an etching stop layer embedded in the substrate;
a plurality of recesses in the substrate, wherein the recesses are located in a central region of the mask, and separated by the protruding portions of the substrate; and
an overlying layer over the substrate in a peripheral region of the mask, wherein the overlying layer comprises a first hard mask layer, a shift layer over the first hard mask layer and a second hard mask layer over the shift layer, and the upper surface of each of the protruding portions is exposed from the first hard mask layer, the shift layer and the second hard mask layer.

14. The mask of claim 13, wherein the recesses partially expose a surface of the etching stop layer.

15. The mask of claim 13, wherein the etching stop layer has a plurality of openings connecting the recesses, respectively.

16. The mask of claim 13, wherein the etching stop layer is optically compatible with the substrate.

17. The mask of claim 16, wherein an index of refraction of the etching stop layer is substantially equal to that of the substrate.

18. The mask of claim 13, wherein the etching stop layer is physically compatible with the substrate.

19. The mask of claim 18, wherein a coefficient of thermal expansion of the etching stop layer is substantially equal to that of the substrate.

20. The mask of claim 13, further comprising a pellicle mounted on the overlying layer.

* * * * *